United States Patent
Lakkapragada et al.

(10) Patent No.: US 7,345,502 B1
(45) Date of Patent: Mar. 18, 2008

(54) DESIGN SECURITY FOR CONFIGURABLE DEVICES

(75) Inventors: Shankar Lakkapragada, San Jose, CA (US); Jesse H. Jenkins, IV, Danville, CA (US)

(73) Assignee: Xilinx, Inc., San Jose, CA (US)

(*) Notice: Subject to any disclaimer, the term of this patent is extended or adjusted under 35 U.S.C. 154(b) by 57 days.

(21) Appl. No.: 11/333,927

(22) Filed: Jan. 17, 2006

(51) Int. Cl.
   *H03K 19/00* (2006.01)
(52) U.S. Cl. .................... 326/8; 326/14; 326/37
(58) Field of Classification Search ............ 326/8, 326/37; 713/1; 714/194
   See application file for complete search history.

(56) References Cited

U.S. PATENT DOCUMENTS

| | | | |
|---|---|---|---|
| 5,898,618 A | 4/1999 | Lakkapragada et al. | |
| 6,525,557 B1* | 2/2003 | McManus et al. ............ | 326/8 |
| 6,788,097 B1 | 9/2004 | Jenkins, IV et al. | |
| 6,981,153 B1* | 12/2005 | Pang et al. .................. | 713/194 |
| 6,988,232 B2* | 1/2006 | Ricchetti et al. ............ | 714/736 |
| 2002/0010853 A1* | 1/2002 | Trimberger et al. ........... | 713/1 |

OTHER PUBLICATIONS

Jenkins, Jesse, IV; CoolRunner-II CPLDs in Secure Applications, Nov. 19, 2002, pp. 1-21, v1.2, WP170, available from Xilinx, Inc., 2100 Logic Drive, San Jose, CA 95124.

* cited by examiner

*Primary Examiner*—Rexford Barnie
*Assistant Examiner*—Crystal L Hammond
(74) *Attorney, Agent, or Firm*—Justin Liu; John J. King

(57) ABSTRACT

Methods and structures for design security in configurable devices are described. In some embodiments, a configurable device may be placed in an unsecured mode allowing for access to configuration data and other diagnostic functions during development and production phases. Once the device is finalized, it may be placed in a secure mode that disables a configuration path and enables a bypass path, thereby securing the configuration data. In some embodiments, the configurable device may be a programmable logic device, such as a complex programmable logic device.

18 Claims, 8 Drawing Sheets

DESIGN SECURITY FOR CONFIGURABLE DEVICES

FIELD OF THE INVENTION

The invention relates to configurable devices, and more particularly, to methods and structures for securing configuration data of configurable devices.

BACKGROUND OF THE INVENTION

Configurable devices are useful because they can be configured to perform various functions based on the needs of the user. One example of a configurable device is a programmable logic device (PLD). A programmable logic device (PLD) is a well-known type of digital integrated circuit that can be programmed to perform specified logic functions.

One type of PLD is the complex programmable logic device (CPLD). A CPLD generally includes two or more "function blocks" connected together and to input/output (I/O) resources by an interconnect switch matrix. Each function block of a CPLD typically includes a two-level AND/OR structure similar to those used in programmable logic arrays (PLAs) and programmable array logic (PAL) devices. In some CPLDs, configuration data is stored on-chip in non-volatile memory, then downloaded to volatile memory as part of an initial configuration sequence. The configuration data configures the function blocks and the interconnect switch matrix to implement the desired functionality.

Another type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., DLLs, RAM, multipliers, transceivers, processors). The CLBs, IOBs, interconnect, and other logic blocks are typically programmed by loading a stream of configuration data (bitstream) into internal configuration memory cells that define how the CLBs, IOBs, and interconnect are configured. The configuration data can be read from memory (e.g., an external PROM) or written into the FPGA by an external device. For some FPGAs, the configuration data may be provided by a non-volatile memory, which may be internal or external to the FPGA. The collective states of the individual memory cells then determine the function of the FPGA.

Other configurable or programmable devices may include devices that are partially programmable. For example, an integrated circuit may include various configurable resources, along with non-configurable "fixed" logic circuits. For all of these configurable devices, the functionality of the device is generally controlled by data bits, also known as a bitstream or configuration data, provided to the device for that purpose. The data bits can be stored in volatile memory (e.g., static RAM cells, as in FPGAs and some CPLDs), in non-volatile memory (e.g., FLASH memory, as in some CPLDs), or in any other type of memory cell.

Thus, for example, a manufacturer may design a product using one or more configurable devices, such as a CPLD, by describing the desired functionality in various software tools, and then generating a bitstream to configure the device to perform the desired functions. Once design of the product is complete and the bitstream for configuring the configurable device has been finalized, the manufacturer may start selling the product including the configurable devices and the corresponding bitstream to customers and end users. One problem facing manufacturers is securing the configuration data. The bitstream represents valuable intellectual property for the manufacturer, and manufacturers often want to restrict access to the bitstream, thus preventing others from copying, reverse engineering, or otherwise misappropriating the bitstream. The manufacturer may also want to restrict other access to the configurable device in order to minimize the possibility that the data could be misappropriated through other indirect means.

Therefore, a need exists to secure the configuration data in a programmable device.

SUMMARY OF THE INVENTION

An integrated circuit and methods are described for securing configuration data. In one embodiment, an integrated circuit may include configuration memory for storing configuration data. Control logic may receive the configuration data. A configuration path coupled to the control logic may store the configuration data in the configuration memory. A bypass path may be coupled to the control logic. Select logic may select one of the configuration path and the bypass path, where the select logic selects the configuration path when the integrated circuit is in an unsecured mode, and the select logic selects the bypass path when the integrated circuit is in a secured mode.

In one embodiment, a method for securing configuration data in a configurable device is described. The method includes placing the configurable device in an unsecured state, providing the configuration data to the configurable device in the unsecured state via a configuration path, and placing the configurable device in a secured state. Placing the configurable device in the unsecured state may include enabling the configuration path. Placing the configurable device in the secured state may include disabling the configuration path and enabling a bypass path.

Additional novel aspects and embodiments are described in the detailed description below. The appended claims, and not this summary, define the scope of the invention.

BRIEF DESCRIPTION OF THE DRAWINGS

The present invention is illustrated by way of example, and not by way of limitation, in the following figures, in which like reference numerals refer to similar elements.

DETAILED DESCRIPTION

Embodiments of the present invention are believed to be applicable to a variety of configurable devices, including programmable logic devices such as CPLDs and FPGAs. While the present invention is not so limited, an appreciation of embodiments the present invention is presented below by way of specific examples, and numerous specific details are set forth to provide a more thorough understanding of embodiments of the present invention. However, it will be apparent to one ordinarily skilled in the art that the present invention can be practiced without these specific details. In other instances, well-known circuits and devices may be omitted or presented in abstract form in order to avoid obscuring the present invention.

Figure 1:
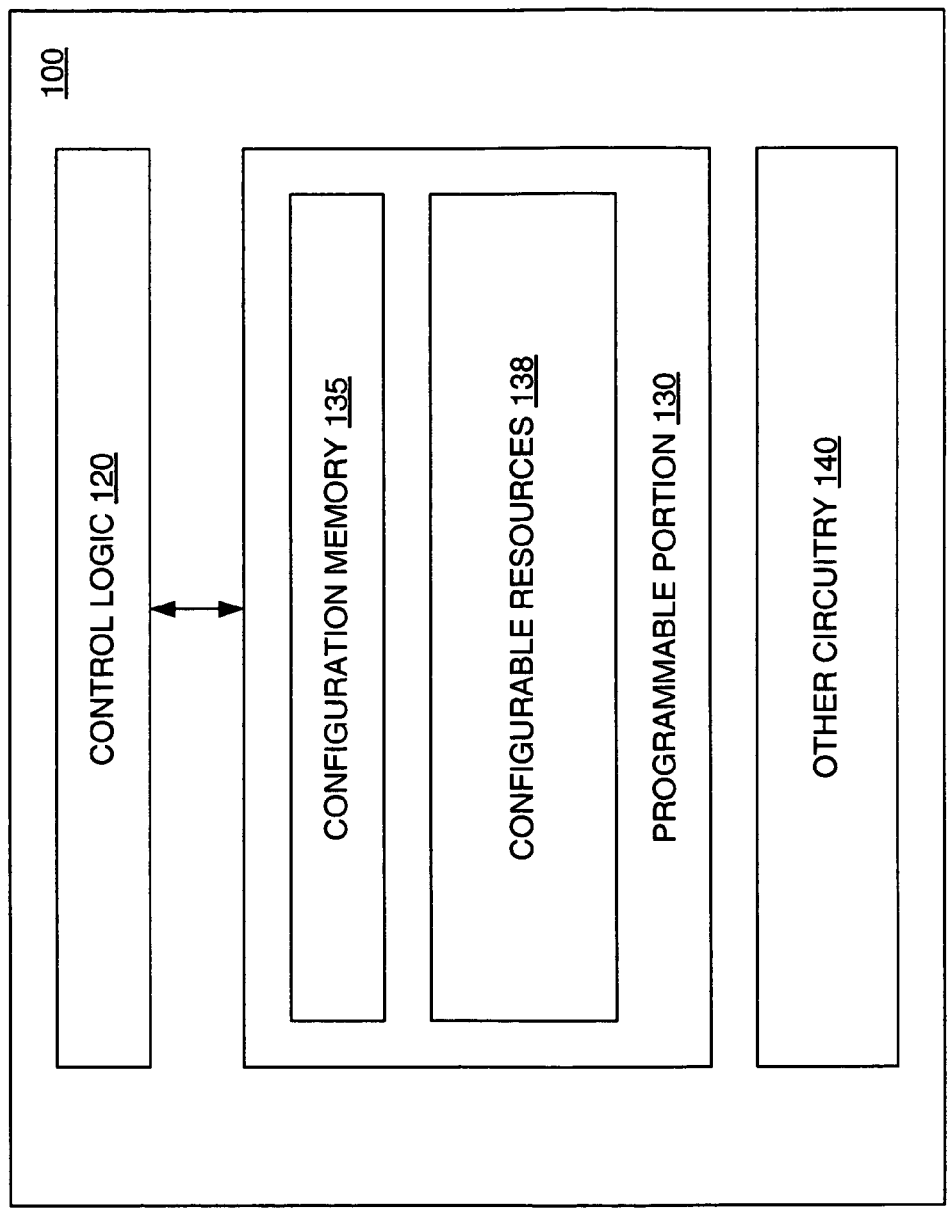
FIG. 1 shows a functional block diagram of a configurable device in accordance with embodiments of the present invention.

FIG. 1 shows a functional block diagram of a configurable integrated circuit or configurable device 100 in accordance with embodiments of the present invention. Configurable device 100 includes control logic 120, programmable or configurable portion 130, and may include additional circuitry 140. Control logic 120 may be used to control configuration of device 100, and may additionally provide other control features. Programmable portion 130 may include configurable resources 138 and configuration memory 135 for storing configuration information, such as a bitstream. Configuration memory 135 may, for example, include nonvolatile memory such as flash memory or EEPROM (electrically erasable programmable read only memory), volatile memory such as SRAM (static random access memory), or a combination of various memory types. Some devices, for instance, may have a combination of nonvolatile and volatile memory where the nonvolatile memory may be used to store data while the device is not powered or not being used. When the device is powered up or reset, configuration data stored in the nonvolatile memory may be transferred to the volatile memory in a configuration loading process. This allows faster volatile memory such as SRAM to be used when the device is in operation, while still allowing the device to be powered down without loss of the data. Configuration memory 135 may be used to store the configuration data that controls functionality of configurable resources 138. Although shown separately in FIG. 1, in some embodiments configuration memory 135 and configurable resources 138 may be integrated and interspersed among each other. For example, each configuration memory bit may be placed near the configurable resource(s) it controls.

The configuration information stored in configuration memory 135 may be used to configure various configurable resources 138. In some embodiments, integrated circuit 100 may be a programmable logic device such as a complex programmable logic device (CPLD) or a field programmable gate array. For instance in CPLD embodiments, configurable resources 138 may include function blocks and interconnecting switch logic. In some embodiments, configurable resources 138 may also include other configurable circuits, such as CLBs, configurable IOBs, soft or hard processors, FIFOs, transceivers, and multipliers, etc. Additional circuitry 140 may include other circuits that may be useful or necessary for integrated circuit 100. For instance, additional circuitry 140 may include ASIC (application specific integrated circuit) blocks or other non-configurable portions.

In general, control logic 120 functions as an interface to configuration memory 135 of programmable portion 130. Once a user has created or generated the configuration data (e.g., a bitstream), that data may be provided to integrated circuit 100 for configuring programmable portion 130 via control logic 120. That is, configuration data may be received and processed by control logic 120, and then provided and stored in configuration memory 135. In some embodiments, the bitstream may be downloaded directly to integrated circuit 100 by a programmer or a similar device, or from a memory or other storage. In some embodiments, the bitstream may be provided to integrated circuit 100 through any number of intermediary devices, such as additional interfaces or a chain of devices. It may be desirable for a designer to have control or other access to the device, such as to perform readback of downloaded configuration data or to exercise special commands, during development and production phases of a product. For example, a user may want to verify that the correct data was downloaded to a device by "reading back" the configuration data. It may also be useful or necessary to have readback functionality or to access other control features of the device, for instance, while testing or debugging a design. However, once the design is complete, the configuration data is finalized, and the device is ready for sale or distribution to customers (e.g., the configuration data has been stored in the device), the user may want to prevent readback of the configuration data stored in the device and disable other control features in order to secure the design. For example, a configured device with its readback and other control functions disabled may be sold to customers and other end users to provide the desired functionality with minimal risk that an unscrupulous user would be able to extract or otherwise misappropriate the configuration data. This allows the manufacturer to protect his investment in the valuable intellectual property embodied by the configuration data.

Figure 2:
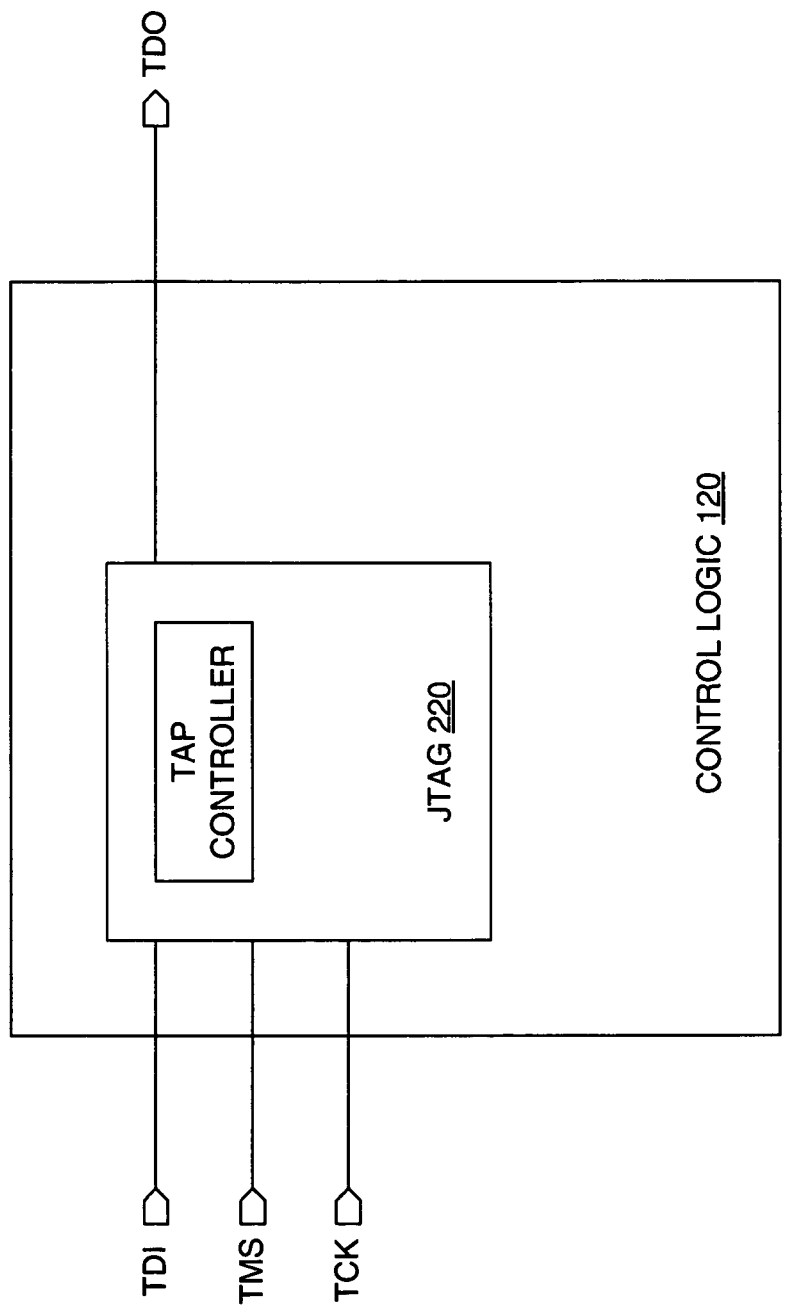
FIG. 2 shows a functional block diagram of configuration logic of a configurable device in accordance with embodiments of the present invention.

FIG. 2 shows a functional block diagram of control logic 120 of a configurable device in accordance with embodiments of the present invention. In some embodiments, control logic 120 may include a JTAG block 220. JTAG is a well-known standard (IEEE 1149.1) for performing test and other functions. As shown, the JTAG block receives three input signals TDI, TMS, and TCK, and provides an output signal TDO. The JTAG standard calls for a TAP (test access port) controller having a state machine responsive to the TMS (test mode select) and TCK (test clock) signals. Depending on the state of the TAP controller set by the TMS and TCK signals, the device may perform various functions. For example, in some modes, serial data may be scanned in though the TDI input, and/or scanned out through the TDO output. One or more control registers may also be set by loading a command through TDI, and results and status may be obtained through TDO. For instance, a program command may be loaded into a control register of a configurable device using the JTAG interface in order to prepare the device to receive configuration data. Configuration data may then be scanned into the device serially through TDI for storage in the configuration memory. A readback command may be loaded into a control register to allow the configuration data stored in the configuration memory to be scanned out through TDO, for example for debugging or verification.

Figure 3:
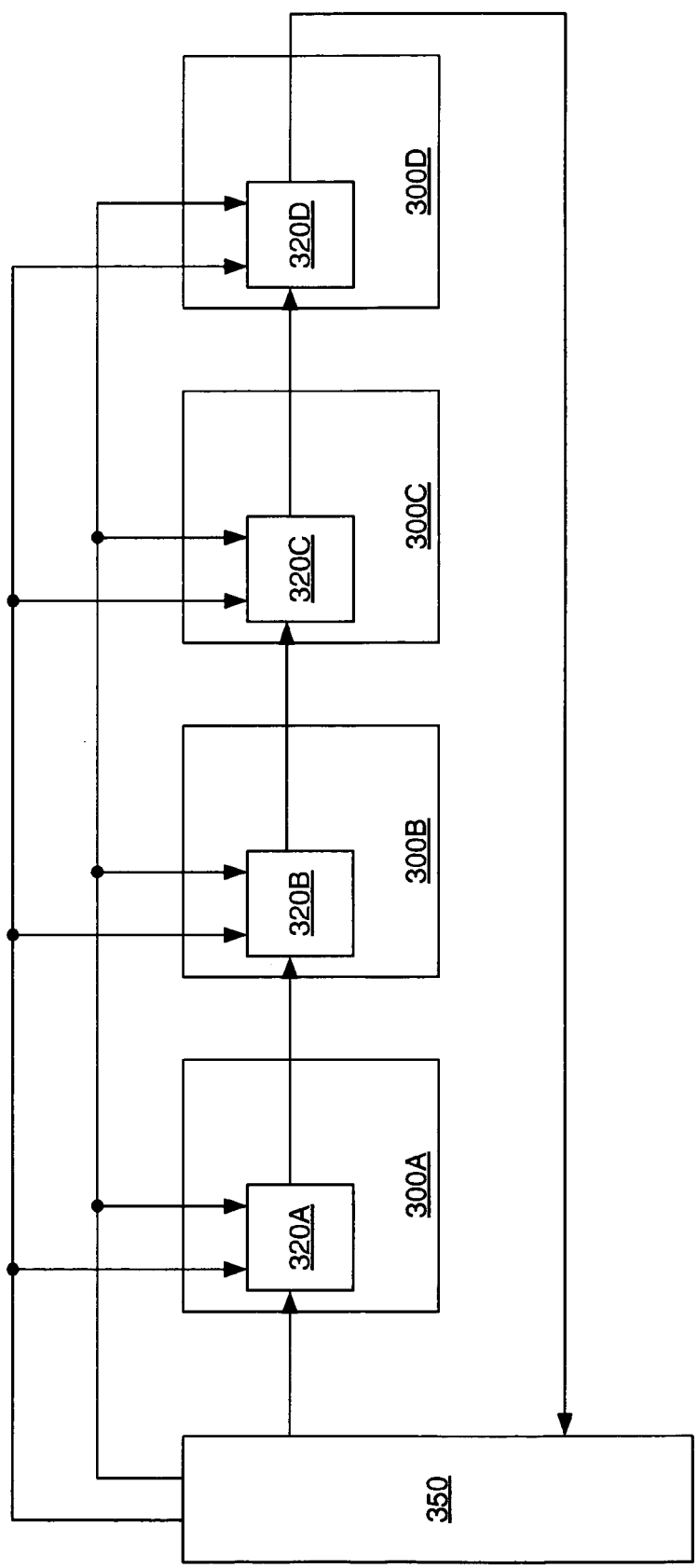
FIG. 3 shows a functional block diagram of a chain of configurable devices in accordance with embodiments of the present invention.

FIG. 3 shows a functional block diagram of a chain of configurable devices in accordance with embodiments of the present invention. As is known to those of skill in the art, two or more devices may be cascaded together to form a serial chain of devices. In particular, if all of the devices in the chain are compatible with the JTAG standard, they may be connected to form a JTAG chain by connecting the TMS and TCK signals in parallel, and chaining the TDO output of each device to the TDI input of the subsequent device. FIG. 3 shows a chain of devices including a programmer 350 and programmable devices 300A-D. Note that while four devices are shown, any number of devices, including both programmable and non-programmable devices, may be part of the chain. Each of programmable devices 300A-D includes a control logic block 320A-D, respectively. As noted above, control logic blocks 320A-D may each include a JTAG block. Programmer 350 may be, for example, a computer connected via a cable or other means to the programmable devices. In other embodiments, programmer 350 may be a standalone device for programming programmable devices. In some embodiments, the programmer may also be a programmable device in the chain acting as a master device. Programmer 350 provides TMS and TCK signals in parallel to programmable devices 300A-D. Programmer 350 also provides a serial data stream to the TDI input of device 300A, the first device in the chain. The TDO output of device 300A is chained to the TDI input of device 300B, the next device in the chain. Devices 300B, 300C, and 300D are similarly chained together through their respective TDI and TDO ports. The TDO output of device 300D, the last device in the chain, may be connected to programmer 350 to receive results and other data from the chain.

In an example system, programmer 350 may include storage for storing configuration data for each of programmable devices 300A-D. For instance, programmer 350 may be a computer having a disk or other storage containing configuration data generated from design files created by a user. The user may then instruct programmer 350 to configure one or more of devices 300A-D. Programmer 350 may download the appropriate configuration data by using the JTAG interface (e.g., TDI, TMS, and TCK). In some instances, the serial data may include header or other identifying and control information. Thus, it may be possible to download data to a particular device in a chain of devices by inserting a device identifier in a header. For example, the programmer may target device 300B for programming by inserting an identifier corresponding to device 300B in the data stream. Each of devices 300A-D may examine the header and see if there is a match to the identifier. If there is no match, the serial data stream may be passed on through the TDO output to the other devices in the chain.

Figure 4A:
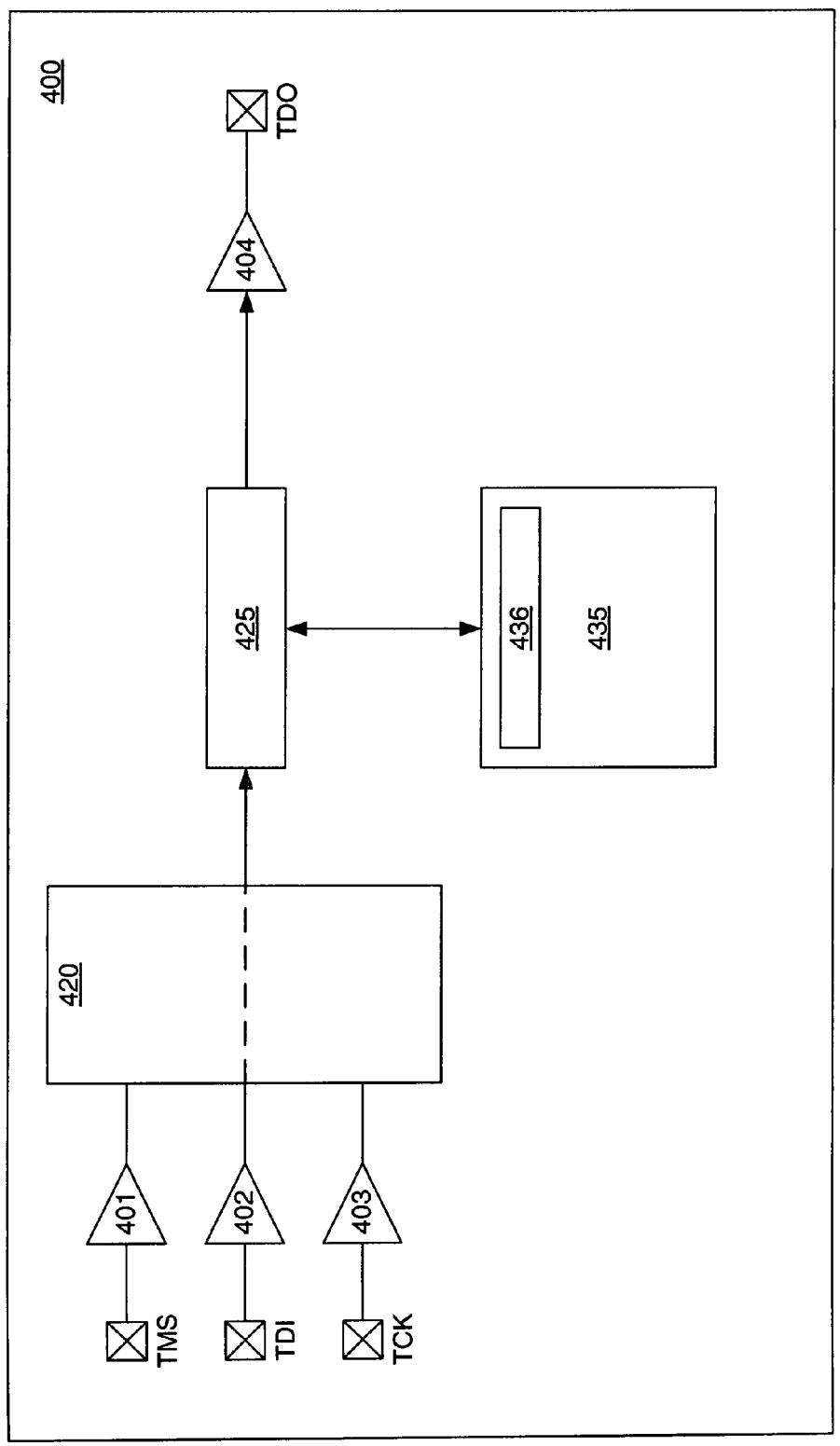
FIGS. 4A and 4B show functional block diagrams of a conventional configurable device having configuration logic.

FIG. 4A shows a functional block diagram of a conventional configurable device 400 having configuration logic. As shown, programmable device 400 includes control logic 420, a configuration register 425, and configuration memory 435, which may include sense amplifiers 436. Control logic 420 may be compatible with the JTAG standard. In some embodiments, control input and output signals (e.g., TMS, TDI, TCK, and TDO signals) may be buffered using one or more buffers, such as buffers 401-404. In the example shown, device 400 has been set to a program mode by an appropriate set of TDI, TMS, and TCK signals. Thus, in this example of a program mode, the TDI input is routed by control logic 420 to configuration register 425. Configuration register 425 may span a row of configuration memory 435, or a portion thereof. Once a complete row has been shifted in via serial input TDI, that row can be programmed (i.e., stored) into the configuration memory array. Subsequent rows may be similarly loaded into configuration register 425 and stored in configuration memory 435 until programming is complete and configuration memory 435 stores the configuration data. In other embodiments, various other programming schemes may be used. For instance, the configuration memory may be programmed by columns rather than rows. In embodiments having a parallel data interface (e.g., a non-JTAG device), multiple bits of the configuration data may be provided to the device in parallel. Serial data interfaces other than JTAG may also be used. Other methods for loading the configuration data into configuration memory 435, such as the parallel interface shown in FIG. 4B, will be known to those of ordinary skill in the art.

Once the configuration memory has been programmed with the desired configuration data, the designer may want to perform a readback of the data in the configuration memory, for instance to verify that the correct data has been programmed or to perform debugging and testing on the design. This may be accomplished by transferring the data that is stored in configuration memory 435 row by row into configuration register 425. In some embodiments of configuration memory 435, this may require the use of one or more sense amplifiers 436, as is well-known. As each row is loaded into configuration register 425, that data may be scanned out through the TDO output port of the JTAG interface. The data may, for instance, be scanned out through the JTAG chain back to programmer 350 for FIG. 3, and analyzed by the designer. In other embodiments, other known techniques for reading a memory may be used. In some embodiments, other diagnostic and control information may also be provided through the TDO output of the JTAG interface to be used by the designer in creating a design. Once the design has been completed (e.g., fully debugged and tested) and the device is ready to be distributed to customers and end users, the designer may wish to disable readback and other control access.

Figure 4B:
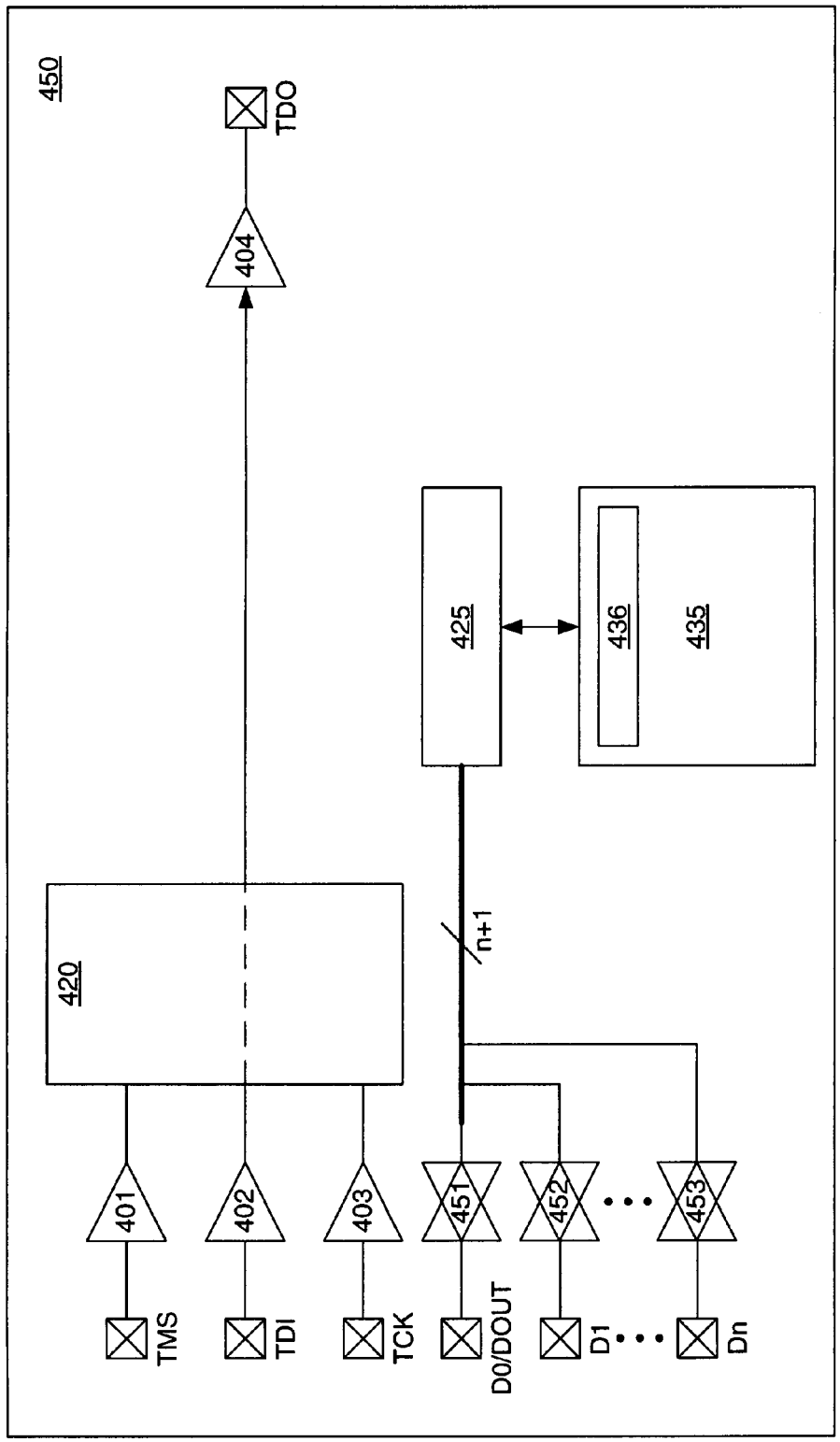

FIG. 4B shows a functional block diagram of another view of a conventional configurable device 450 having configuration logic. Programmable device 450 may include a parallel interface for receiving configuration data. As shown, pins D0/DOUT through Dn form a parallel interface for loading data (e.g., over a parallel (n+1)-bit bus) into configuration memory 435. A parallel interface may offer performance benefits over a serial interface. For example, if n=7, eight bits of configuration data may be loaded into configuration register 425 at a time. In some instances, pins D0 through Dn may be bidirectional pins coupled to respective bidirectional buffers (transceivers) 451-453. Configuration data may be read back through pins D0-Dn in such a bidirectional arrangement. In other instances, a separate serial or parallel interface may be provided for readback. Other combinations of serial or parallel interfaces will be known to those of ordinary skill in the art.

Figure 5A:
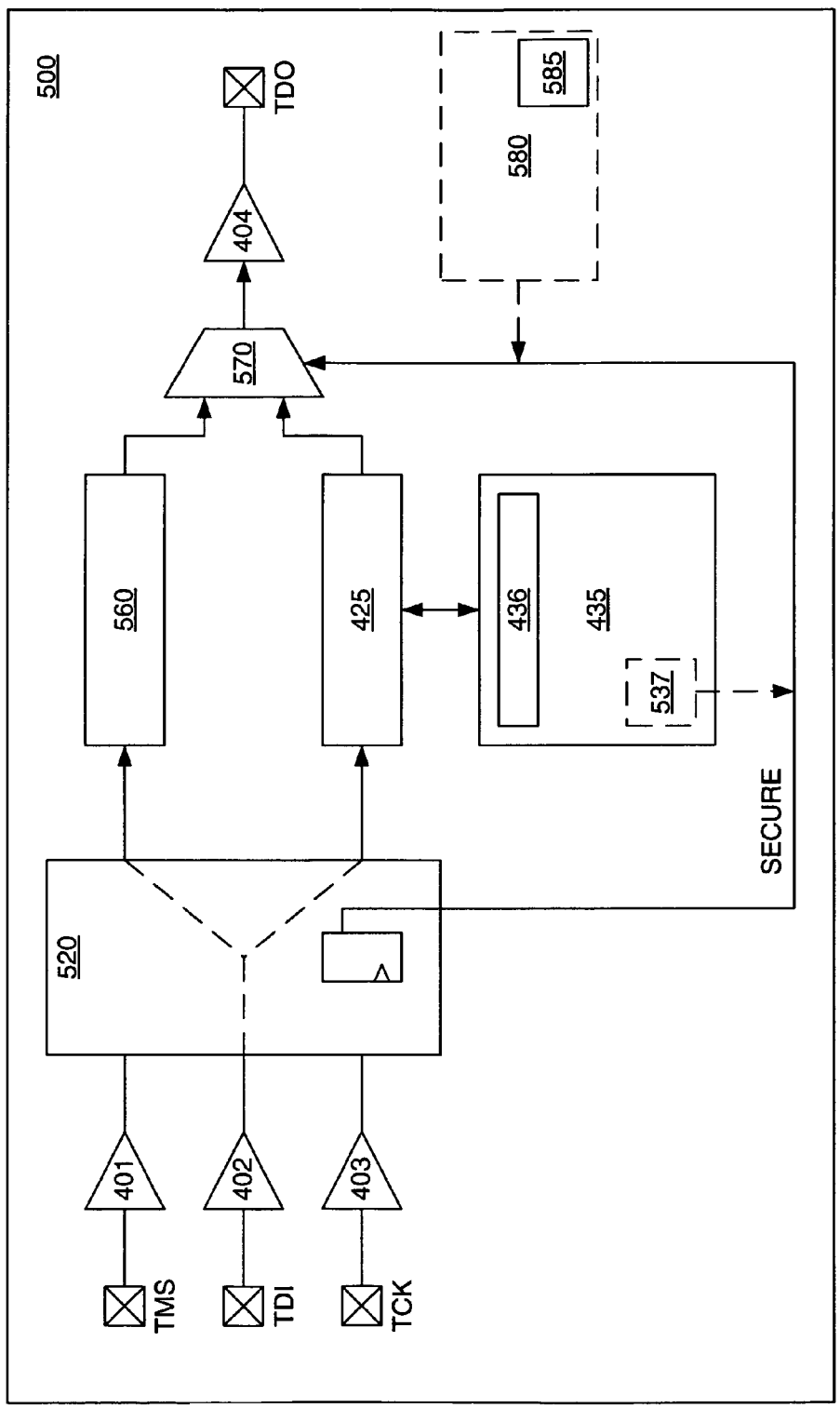
FIGS. 5A and 5B show functional block diagrams of a configurable device having configuration logic in accordance with embodiments of the present invention.

FIG. 5A shows a functional block diagram of a configurable device 500 having configuration logic in accordance with embodiments of the present invention. Device 500 is similar to device 400, but additionally includes a bypass register 560 and select logic 570. As shown, the serial input data from the TDI input port may be provided via control logic block 520 to both configuration register 425 and bypass register 560. The outputs of configuration register 425 and bypass register 560 are coupled to the inputs of select logic 570, implemented here as a 2-1 multiplexer. The select terminal of multiplexer 570 is controlled by a SECURE signal. As will be described in greater detail below, multiplexer 570 selects a configuration path (e.g., through configuration register 425) when the device is in an unsecured mode, and selects a bypass path (e.g., through bypass register 560) when the device is in a secured mode.

In some embodiments, the SECURE signal may be provided by the JTAG block, for instance by a register, such as a JTAG register, within the JTAG block as shown in FIG. 5A. The SECURE signal may also be provided by another circuit block 580, as shown by the dashed line in FIG. 5A. In some embodiments, circuit block 580 may include nonvolatile storage, such as a nonvolatile memory or a one-time programmable memory element. Note that while block 580 is shown as part of device 500, in some embodiments, part or all of block 580 may be external to the device. In other embodiments, one or more memory elements 537, which may be part of memory 435, may be used to provide the SECURE signal. For example, one or more memory bits may be combined by an AND gate or other logic to provide the SECURE signal. Using multiple bits may improve reliability and security.

While the design is under development, the SECURE signal may remain unasserted, thereby placing the device in an unsecured state. In this state, the device may behave substantially the same as device 400 in FIG. 4A. While in the unsecured state (where SECURE is not asserted) multiplexer 570 to select the output of configuration register 425 to be provided to the TDO output, allowing the designer to perform readback and other diagnostic functions as described above with respect to FIG. 4A. Thus, the contents of configuration memory 435 may be loaded into configuration register 425 and scanned out through TDO while SECURE remains unasserted, as described above. Once the design is completed and the final design has been downloaded to the device, the SECURE signal may be forced to an asserted state, thus enabling only the bypass path through bypass register 560, and effectively disabling the path through configuration register 425, and thereby placing the device in a secured state. In some embodiments, bypass register may be a single bit register that may be clocked by TCK or another clock. In other embodiments, the bypass register may include more than one bit, such as a multi-bit shift register. When the device is secured in this manner, the path through configuration register 425 is disabled and the path through bypass register 560 is enabled, thereby effectively forcing the device into a JTAG bypass mode. Thus by asserting the SECURE signal, the designer prevents any subsequent user from accessing configuration register 425 and the configuration data stored in configuration memory 435. Asserting the SECURE signal also prevents access to any control features of control logic 520. In effect, control logic 520 itself, is bypassed, and there is no access to any control features, such as readback. Note that in some embodiments, select logic 570 may be placed at the input side of the configuration and bypass paths, where only one of the paths would receive data from control logic 520 depending on the status of the SECURE signal. In other embodiments, select logic 570 may be integrated into control logic 520, or even placed between the TDI input and control logic 520. In general, select logic 570 may be used to select the configuration path when the device is in an unsecured state, and to select the bypass path when the device is in a secured state.

As noted above, in some embodiments the SECURE signal may be provided from a nonvolatile memory, either internal or external to the device. For example, the SECURE signal may be provided by one-time programmable memory or other permanent programming method to lock the device in secure mode once the design is finalized. In some embodiments, the SECURE signal may be provided by one or more nonvolatile memory bits, which may be included in memory 435. In particular, since asserting the SECURE signal enables the bypass path and disables any access to memory 435, it would be impossible for an attacker to de-assert SECURE in an attempt to gain access to the configuration data stored in memory 435. The SECURE signal may also be provided from a register within the JTAG block or elsewhere in the device, or from other logic or circuitry within the device. In some embodiments, block 580 for providing the SECURE signal may include an authentication block 585 for restricting access to the SECURE signal. The authentication scheme may require that anyone attempting to change the status of the SECURE signal to provide a secret key or other unique identifier known only to the designer, or to properly respond to a challenge or other query. In some instances, authentication block 585 may be coupled to a decryption engine (not shown) and only allow the secured status of the device to be altered if one or more decryption keys have been received. Other methods and structures for controlling and restricting access to the SECURE signal will be known to those of skill in the art. In general, it is desirable that once the device has been placed in the secured state, it is difficult or impossible to return the device to an unsecured state. That is, access to the SECURE signal should be restricted, and in particular, it should be difficult or impossible to de-assert the SECURE signal once it has been asserted. As noted above, this may be achieved through the use of one-time programmable bits, or otherwise removing the ability to change the value of SECURE once it has been asserted.

Figure 5B:
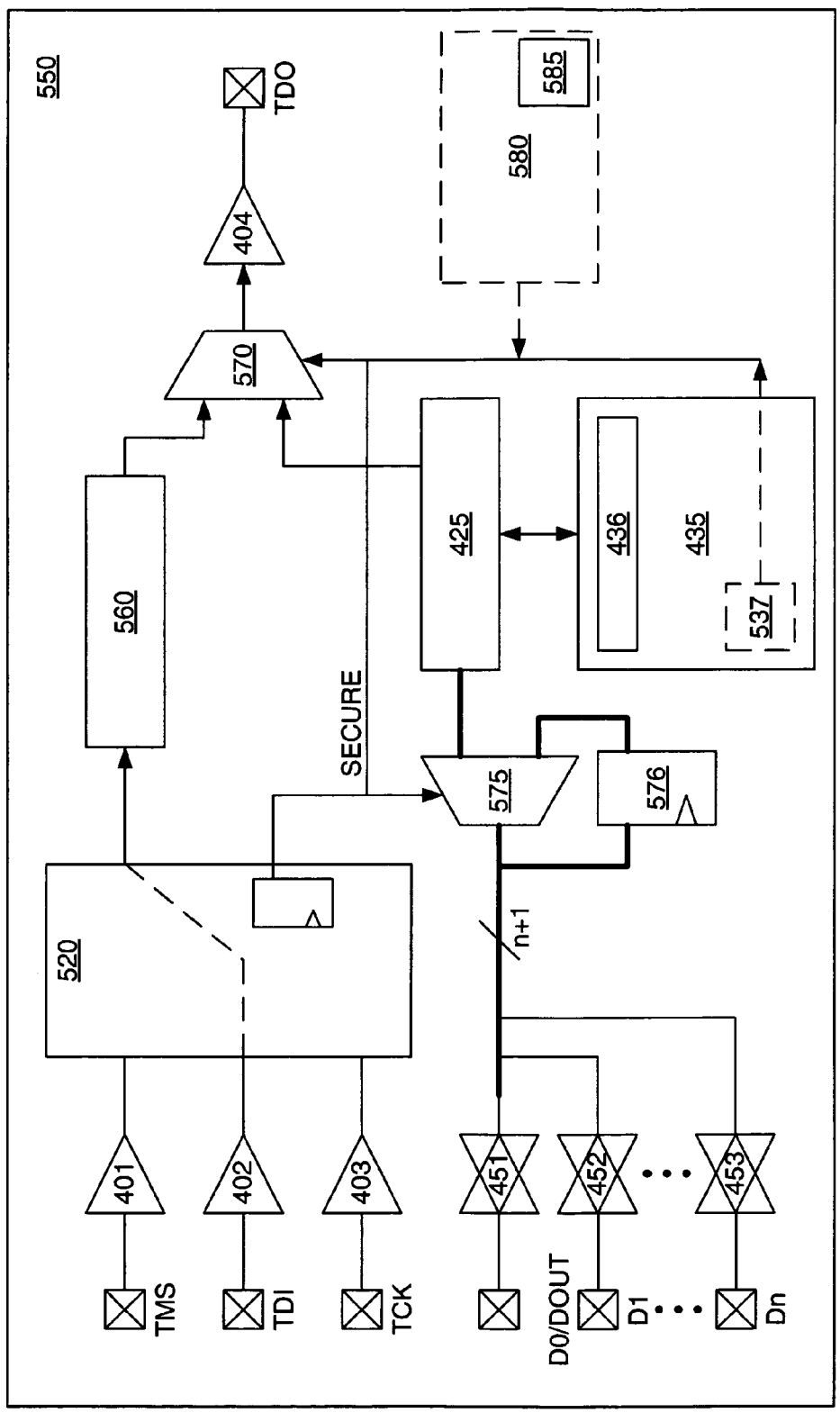

FIG. 5B shows a functional block diagram of an example of a configurable device 550 having configuration logic in accordance with embodiments of the present invention. Device 550 is similar to device 500 with the parallel interface shown in device 450. As shown, device 550 further includes a multiplexer 575 having one input coupled to configuration register 425 and an output coupled to a data bus connected to a parallel data interface. As described above with respect to FIG. 5A, during a development stage, the SECURE signal may be unasserted, leaving device 550 in an unsecured state. In the unsecured state, access to configuration register 425 is available through the parallel interface including pins D0-Dn. Additional access may be provided through a JTAG or other control interface. Once the design has been finalized and the configuration data loaded into configuration memory 435, the SECURE signal may be asserted, as described above. Asserting the SECURE signal selects the second input of multiplexer 575, which in some instances may be connected to a feedback register 576. In other instances the second input may be a simple unregistered feedback loop, or may be disconnected. Importantly, access to configuration register 425 is eliminated once the SECURE signal has been asserted. Thus, the device is secure and no access to configuration register 425 or configuration memory 435 is possible.

Figure 6:
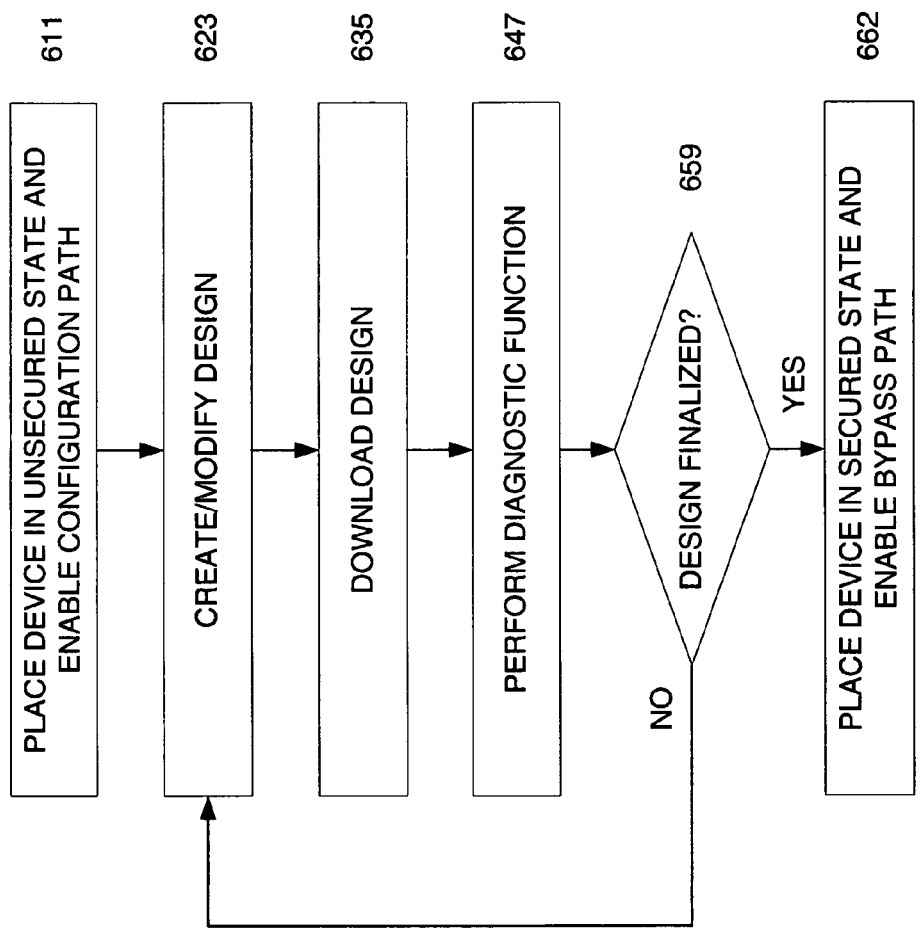
FIG. 6 shows a flowchart of a method for securing design data in a configurable device in accordance with embodiments of the present invention.

FIG. 6 shows a flowchart of a method 600 for securing design data in a configurable device in accordance with embodiments of the present invention. First, the device is placed in an unsecured state, for example by de-asserting a SECURE signal, in which a configuration path may be selected (step 611). Next, a design targeted for the device having the desired functionality is created or modified (step 623), and the design is downloaded to the device (step 635). The designer may perform various diagnostic functions such as readback to verify the design (step 647). The designer may then determine whether the design is in final form (decision step 659). If further changes are desired, steps 623, 635, 647 may be repeated to further modify the design. Once the design is complete and in final form, the device may be secured (step 662), for example by asserting a SECURE signal to enable a bypass path (and disable the configuration path). The device may now be distributed to customers and other end users with substantially reduced risk that the configuration data stored in the configuration memory will be misappropriated. As noted above, it may be impossible to unsecure the device once it has been secured, and the SECURE signal asserted. In other embodiments, it may be possible for the designer to unsecure the device only by causing a global erase or reset that erases substantially the entire device. Thus, the device is returned to a blank or unconfigured state, and the designer must reprogram the device in order to return it to a configured or functional state. This allows, for example, updated or new configuration data to be loaded into the device, while still maintaining security of the configuration data.

Some or all of the methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having ordinary skill in the relevant arts of the invention will now perceive various modifications and additions that can be made as a result of the disclosure herein. For example, the above text describes the circuits and methods of embodiments the invention in the context of integrated circuits such as programmable logic devices. However, embodiments of the invention may also be implemented in other configurable systems.

Furthermore, components other than those described herein may be used to implement embodiments of the invention, and active-high signals may be replaced with active-low signals by making straightforward alterations to the circuitry, such as are well known in the art of circuit design. Logical circuits may be replaced by their logical equivalents by appropriately inverting input and output signals, as is also well known.

Moreover, some components are shown directly connected to one another while others are shown connected via intermediate components. In each instance, the method of interconnection merely establishes some desired electrical communication between two or more circuit nodes. Such communication can often be accomplished using a number of circuit configurations, as will be understood by those of ordinary skill in the art.

Accordingly, all such modifications and additions are deemed to be within the scope of the invention, which is to be limited only by the appended claims and their equivalents.

What is claimed is:

1. An integrated circuit having secured and unsecured operation modes, the integrated circuit comprising:
   configuration memory for storing configuration data;
   control logic for receiving the configuration data;
   a configuration path comprising a configuration register coupled to the control logic for storing the configuration data in the configuration memory;
   a bypass path comprising a bypass register coupled to the control logic; and
   select logic enabling the selection of one of the configuration path and the bypass path based upon the operation mode of the integrated circuit;
   wherein when the integrated circuit is in the unsecured operation mode, the select logic selects the configuration path, and
   wherein when the integrated circuit is in the secured operation mode, the select logic selects the bypass path to prevent the configuration data from being accessed.

2. The integrated circuit of claim 1 further comprising configurable resources coupled to the configuration memory, wherein the configuration data is used to configure the configurable resources.

3. The integrated circuit of claim 2 wherein the configurable resources comprise at least one of a plurality of complex programmable logic device (CPLD) function blocks and a plurality of configurable logic blocks (CLBs).

4. The integrated circuit of claim 2 wherein the integrated circuit is at least one of a programmable logic device, a complex programmable logic device, and a field programmable gate array.

5. The integrated circuit of claim 1 further comprising an authentication block for providing a secure signal.

6. The integrated circuit of claim 5 wherein the authentication block comprises a decryption circuit.

7. The integrated circuit of claim 1 further comprising a storage element for providing a secure signal.

8. The integrated circuit of claim 7 wherein the storage element comprises at least one memory bit in the configuration memory.

9. The integrated circuit of claim 7 wherein the storage element comprises a register in the control logic.

10. The integrated circuit of claim 7 wherein the storage element comprises a one-time programmable memory.

11. The integrated circuit of claim 1 wherein the select logic comprises a multiplexer coupled to the configuration path and the bypass path.

12. The integrated circuit of claim 1 wherein the control logic comprises at least one interface selected from the group consisting of a JTAG interface, a serial interface, and a parallel interface.

13. The integrated circuit of claim 12 further comprising a serial data input and a serial data output for coupling the integrated circuit to at least one other device in a scan chain.

14. A method for securing configuration data in a configurable device, the method comprising:
   placing the configurable device in an unsecured state based upon a mode selection signal,
   wherein placing the configurable device in the unsecured state comprises enabling a configuration path;
   providing the configuration data to the configurable device in the unsecured state via the configuration path; and
   placing the configurable device in a secured state after storing the configuration data in a configuration memory,
   wherein placing the configurable device in the secured state disables the configuration path and enables a bypass path to prevent the configuration data from being accessed.

15. The method of claim 14 further comprising performing at least one diagnostic function on the configurable device in the unsecured state.

16. The method of claim 14 wherein placing the configurable device in the secured state comprises programming at least one nonvolatile memory.

17. The method of claim 14 wherein placing the configurable device in the secured state comprises receiving authentication data.

18. A configurable device comprising:

means for designating an operation mode;

means for receiving configuration data;

means for configuring configurable resources of the configurable device during an unsecured operation mode;

means for bypassing the means for configuring during a secured operation mode to prevent the configuration data from being accessed; and means for selecting one of the means for configuring and the means for bypassing;

wherein when the configurable device is in an unsecured operation mode, the means for selecting selects the means for configuring, and wherein when the configurable device is in a secured operation mode, the means for selecting selects the means for bypassing.

* * * * *